United States Patent [19]

Chen et al.

[11] Patent Number: 5,950,090
[45] Date of Patent: Sep. 7, 1999

[54] METHOD FOR FABRICATING A METAL-OXIDE SEMICONDUCTOR TRANSISTOR

[75] Inventors: Coming Chen, Taoyuan Hsien; Tony Lin, Kaohsiung Hsien; Jih-Wen Chou, Hsinchu, all of Taiwan

[73] Assignee: United Microelectronics Corp., Hsinchu, Taiwan

[21] Appl. No.: 09/193,217

[22] Filed: Nov. 16, 1998

[51] Int. Cl.$^6$ .................................................. H01L 21/336
[52] U.S. Cl. ........................... 438/296; 438/305; 438/306; 438/424; 438/437
[58] Field of Search ..................................... 438/296, 305, 438/306, 307, 424, 437

[56] References Cited

U.S. PATENT DOCUMENTS 5,879,983   3/1999   Segawa et al. ........................ 438/253

*Primary Examiner*—Brian Dutton
*Assistant Examiner*—Long Pham
*Attorney, Agent, or Firm*—Hickman Stephens & Coleman

[57] ABSTRACT

A method for fabricating a MOS transistor device is provided. The method contains sequentially forming an oxide layer, a polysilicon layer, and a cap layer over a semiconductor substrate. Patterning the oxide layer, the polysilicon layer, the cap layer, and the substrate forms a trench opening in the substrate. A shallow trench isolation (STI) structure is formed by filling the opening with insulating material. A first-stage gate structure is formed on the substrate by patterning the oxide layer, the polysilicon layer, and the cap layer. A top portion of the STI structure above the substrate surface is exposed. A light ion implantation is performed to form a lightly doped region. Several spacers are respectively formed on each sidewall of the first-stage gate structure and each exposed sidewall of the STI structure. A heavy ion implantation process is performed to form interchangeable source/drain regions at each side of the first-stage gate structure. The cap layer is removed to leave an opening. A conductive layer is formed over the substrate and is planarized so that a remaining portion of the conductive layer fills the opening to serve as a gate metal layer. The remaining portion of the conductive layer also fills a free space between the spacers above the interchangeable source/drain regions to form several contact plugs. A dielectric layer is formed over the substrate with second contact plugs, respectively electrically coupled to the gate metal layer and the first contact plugs.

20 Claims, 5 Drawing Sheets

5,950,090

METHOD FOR FABRICATING A METAL-OXIDE SEMICONDUCTOR TRANSISTOR

BACKGROUND OF THE INVENTION

1. Field of the Invention

This invention relates to semiconductor fabrication, and more particularly to a method for fabricating a metal-oxide semiconductor (MOS) transistor.

2. Description of Related Art

Fabrication of MOS transistors is an essential part in a very large scale integration (VLSI) fabrication. The MOS transistors are widely used in all various semiconductor devices, such as microprocessors, memory devices, power sources and so on. The MOS transistors are the key elements in the semiconductor devices. A typical fabrication method of MOS transistor includes first forming several isolation structures on a semiconductor substrate to form active areas. Each active area is the area between two isolation structures. A MOS transistor is to be formed on one active area. The isolation structures can prevent carriers from drifting between two neighboring MOS transistors. A formation of the MOS transistor further includes forming a gate structure and forming two interchangeable source/drain regions respectively at each side of the gate structure in the semiconductor substrate. Then, a dielectric layer is formed over the substrate, a contact is formed in the dielectric layer to have an electric coupling with desired one of the interchangeable source/drain regions. An interconnect structure is subsequently formed over the dielectric layer. The interconnect structure usually includes multilevel interconnects. The lowest level is electrically coupled to the MOS transistor through the contact. Each different interconnect level is electrically coupled to each other through a via structure.

The conventional method for fabricating the MOS transistor is complicate. As the device integration increases, it becomes difficult to fabricate the MOS transistor. This difficulty can be seen in the following example of a conventional MOS transistor. FIGS. 1A–1G are cross-sectional views of a portion of a substrate, schematically illustrating conventional fabrication processes for forming a MOS transistor.

In FIG. 1A and FIG. 1B, a pad oxide layer 102 is formed over a semiconductor substrate 100. A silicon nitride layer 104 is formed over the pad oxide layer 102. In FIG. 1B, a shallow trench 105 is formed in the substrate 100 by patterning the silicon nitride layer 104, the pad oxide layer 102, and the substrate 100. The patterning process includes photolithography and anisotropic etching. The anisotropic etching process etches the silicon nitride layer 104, the pad oxide layer 102 and the substrate 100, in which the silicon nitride layer 104 and the pad oxide layer 102 respectively become a silicon nitride layer 104a and a pad oxide layer 102a. An oxide layer 108 is formed over the substrate 100 so that the trench 105 is also filled.

In FIG. 1B and 1C, a chemical mechanical polishing (CMP) process is performed to polish the oxide layer 108 so as to expose the silicon nitride layer 104a. The silicon nitride layer 104a and the pad oxide layer 102a are respectively removed by wet etching with different etchant solution. The oxide layer 108 is also etched during wet etching, resulting in a remaining portion, that is, an oxide layer 108a to fill the trench 105. A shallow trench isolation (STI) structure is formed. The substrate 100 other than the trench 105 is exposed.

In FIG. 1D, a MOS transistor is to be subsequently formed. A thermal oxidation process is performed to form an oxide layer 110, serving as a gate oxide layer later, over the substrate 100. A polysilicon layer 112 is formed on the oxide layer 110 by chemical vapor deposition (CVD).

In FIG. 1D and FIG. 1E, the oxide layer 110 and the polysilicon layer 112 are patterned and respectively become a gate oxide layer 110a and a gate polysilicon layer 112a, both of which form together as a gate structure. A light ion implantation process is performed to two lightly doped regions respectively at each side of the gate structure in the substrate 100. A spacer 116 is formed on each sidewall of the gate structure. A heavy ion implantation process is performed to form a heavily doped region on the lightly doped region. Two interchangeable source/drain regions 118 with a lightly doped drain (LDD) structure are formed in the substrate 100 at each side of the gate structure, which includes the gate oxide layer 110a and the gate polysilicon layer 112a. In order to reduce sheet resistance on the interchangeable source/drain regions 118, a self-aligned silicide (Salicide) layer 115 is necessarily formed on the interchangeable source/drain regions 118, and a Salicide layer 114 is necessarily formed on the gate polysilicon layer 112a. A MOS transistor including the gate polysilicon layer 112a, the gate oxide layer 110a and the interchangeable source/drain regions 118 is formed. A dielectric layer 120 is formed over the substrate 100 so as to isolate the MOS transistor from a subsequent formation of an interconnect structure.

In FIG. 1E and FIG. 1F, the dielectric layer 120 is planarized and patterned to form a dielectric layer 120a. There are, for example, two contact openings 122 and 123 formed in the dielectric layer 120a so as to respectively expose the Salicide layer 115 and the Salicide layer 114. A metal layer 124 is deposited over the substrate 100 so that the contact openings 122, 123 are also filled.

In FIG. 1F and FIG. 1G, a portion of the metal layer 124 other than the contact openings 122, 123 is removed by chemical mechanical polishing (CMP). The dielectric layer 120a is exposed and a remaining portion of the metal layer 124 becomes a metal plug 124a filled in the contact opening 122, and a metal plug 124b filled in the contact opening 123.

In the conventional method described above, as the oxide layer 108a is formed as shown in FIG. 1C, a recess structure 150 usually occurs at the top corners 140, resulting from the wet etching. The oxide layer 108a has a weaker structure at the top corners 140 due to a discontinuation of material. When the wet etching process with its isotropic property is performed to remove the silicon nitride layer 104a and the pad oxide layer 102a to form the oxide layer 108a, and a subsequent cleaning process is routinely performed, the recess structure 150 occurs inevitably. The recess structure 150 may cause a kink effect, which further causes a sub-threshold voltage when a polysilicon gate is formed later.

Moreover, the Salicide layer 115 usually is formed by forming a metal layer over the substrate, and performing a thermal process to cause a reaction between the silicon material in the substrate 100 and the metal layer and form the Salicide layers 114, 115. Then the portion of the metal layer without reaction is removed. Even through the Salicide layer 115 can reduce sheet resistance, it consumes the junction depth of the interchangeable source/drain regions 118, resulting in a charge leakage.

Furthermore, as the device integration increases, the device dimension is reduced. When device critical dimension is down to a deep sub-micron level, it is very difficult to form the Salicide layer 114 on the gate polysilicon layer 112a. In addition, the intrinsic gate resistance of the gate polysilicon layer 112a is accordingly increased as the gate dimension is reduced, resulting in a longer response time of the MOS transistor.

Currently, in order to reduce the gate resistance, a metallic gate is developed to take the place of the gate polysilicon layer 112a but this alternative conventional method may easily cause an acid-tank contamination due to a necessary etching process to form the metallic gate.

Moreover, since the depth of the contact opening 123 is smaller than the depth of the contact opening 122, when the etching process is performed to simultaneously form the contact openings 122, 123, the formation of the contact opening 123 is earlier than the formation of the contact opening 122. In order to complete the formation of the contact opening 122 to expose the Salicide layer 115, the Salicide layer 114 exposed by the opening 123 may be over etched, resulting in an etching damage. The electrical property on the Salicide layer 114 is therefore degraded.

Moreover, as device integration increases, the aspect ratio (AR), which is a ratio of depth to bottom width, of the contact opening 122 increases also, and a borderless contact strategy is also applied. The borderless contact strategy allows the contact opening 122 to be partially located on the interchangeable source/drain regions 115 without precisely alignment. In order to form a contact plug in a high AR contact opening 122 with sufficient step coverage capability, the top corners of the high AR contact opening 122 need to be rounded, or the sidewall of the high AR contact opening needs to be slanted to form a taper contact with a taper angle of 87°. Since the taper contact opening needs wider top width, the borderless contact strategy is applied. If the device dimension is maintained to be still high integration, both the rounded contact opening and the taper contact opening need a higher fabrication capability to achieve it.

On the other hand, if a misalignment in photolithography occurs on formation of the contact opening 122, the contact opening 122 may cover a portion of the STI structure 108a, resulting in an undesired etching on the STI structure 108a and causing a current leakage.

SUMMARY OF THE INVENTION

It is therefore an objective of the present invention to provide a method for fabricating a MOS transistor device so as to prevent a kink effect from occurring on a STI structure.

It is another an objective of the present invention to provide a method for fabricating a MOS transistor device so as to reduce the sheet resistance of interchangeable source/drain regions without consuming its junction depth.

It is another yet an objective of the present invention to provide a method for fabricating a MOS transistor device so as to have a gate structure with lower resistance, higher response time, and high operation speed.

It is still another an objective of the present invention to provide a method for fabricating a MOS transistor device so as to prevent an acid-tank contamination from occurring.

It is still another yet an objective of the present invention to provide a method for fabricating a MOS transistor device so as to simplify a formation of a high aspect ratio (AR) contact openings with sufficient step coverage capability. The fabrication capability is not necessary to be required to have high performance so that the fabrication of the MOS transistor device can be greatly easier.

In accordance with the foregoing and other objectives of the present invention, an improved method for fabricating a MOS transistor device is provided. The improved method includes sequentially forming an oxide layer, a polysilicon layer, and a cap layer over a semiconductor substrate. Patterning the oxide layer, the polysilicon layer, the cap layer, and the substrate forms a trench opening in the substrate. A shallow trench isolation (STI) structure is formed by filling the trench opening with insulating material, in which the STI structure has a top surface with the same height as the surface of the cap layer. A first-stage gate structure is formed on the substrate by further patterning the oxide layer, the polysilicon layer, and the cap layer. The cap layer in the first-stage gate structure is a sacrificial layer, and is to be replaced by a gate metal layer later. In the formation of the first-stage gate structure, a portion of the STI structure above the substrate is exposed. A light ion implantation is performed to form a lightly doped region in the substrate at each side of the first-stage gate structure. Several spacers are respectively formed on each sidewall of the first-stage gate structure and each exposed sidewall of the STI structure. A heavy ion implantation process is performed to form interchangeable source/drain regions with lightly doped drain (LDD) structure at each side of the first-stage gate structure. The cap layer is removed to leave a gate opening. A conductive layer is formed over the substrate and is planarized so that a remaining portion of the conductive layer fills the gate opening to serve as a gate metal layer. The remaining portion of the conductive layer also fills a free space between the spacers above the interchangeable source/drain regions to form several first contact plugs on the interchangeable source/drain regions. At this stage, the first source/drain contact plugs, the gate metal layer, and the STI structure have the same height due to planarization. A dielectric layer is formed over the substrate with second contact plugs, respectively electrically coupled to the gate metal layer and the first contact plugs.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
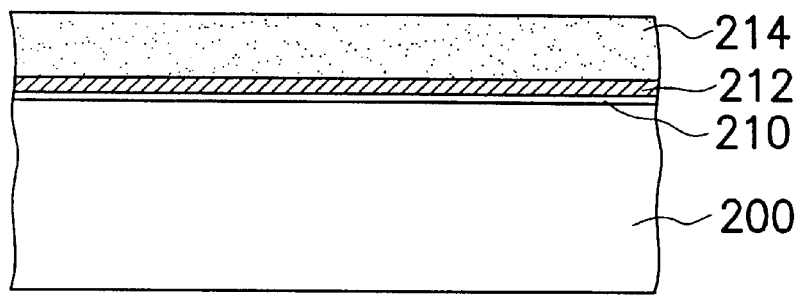
FIGS. 2A–2G are cross-sectional views of a portion of a substrate, schematically illustrating a fabrication process for forming a MOS transistor device, according to a preferred embodiment of the invention.

FIGS. 2A–2G are cross-sectional views of a portion of a substrate, schematically illustrating a fabrication processes for forming a MOS transistor device, according to a preferred embodiment of the invention. In FIG. 2A, an oxide layer 210 with a thickness of about 50 Å–200 Å is formed over a semiconductor substrate 200 by, for example, thermal oxidation or chemical vapor deposition (CVD). A polysilicon layer 212 with a thickness of about 1500 Å–2000 Å is formed over the oxide layer 210 by, for example, CVD. A cap layer 214 with a thickness of about 1500 Å–2500 Å is formed over the polysilicon layer 212 by, for example, CVD or low pressure CVD (LPCVD). A material used in the cap layer 214 is chosen to have a different etching rate from the polysilicon layer 212 and a STI structure, which is to be formed later. The cap layer 214 preferably includes silicon nitride.

Figure 2B:
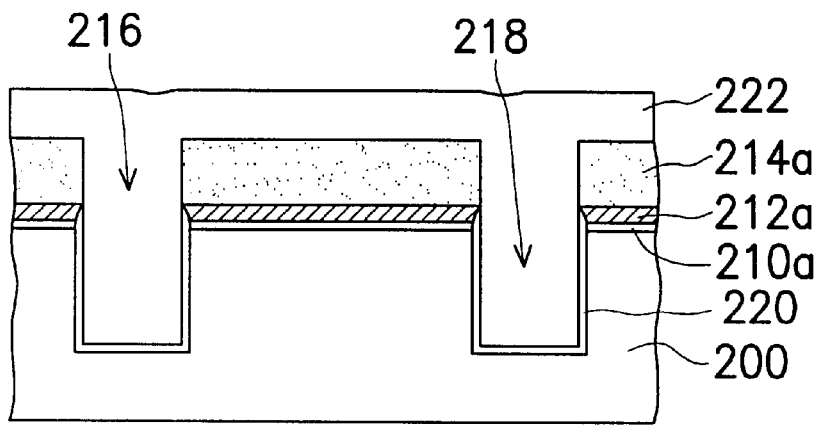

In FIG. 2A and FIG. 2B, an opening 216 is formed by patterning the cap layer 214, the polysilicon layer 212, the oxide layer 210, and the substrate 200. The opening 216 includes a trench 218, which is a portion in the substrate 200. After patterning, the cap layer 214, the polysilicon layer 212, and the oxide layer 210 respectively become a cap layer 214a, a polysilicon layer 212a, and an oxide layer 210a. A liner oxide layer 220 with a thickness of about 200 Å–900 Å, conformal to the trench 218, is formed over the trench 218 by thermal oxidation. Since the side the polysilicon layer 212a exposed in the opening 216 is also oxidized, the liner oxide layer 220 actually has a height up the surface of the polysilicon layer 212a. An insulating layer 222 including, for example, silicon oxide is formed over the substrate 200, in which the opening 216 is also filled by the insulating layer 222. The formation of the insulating layer 222 of silicon oxide preferably includes using tetra-ethyl-ortho-silicate (TEOS) as a reaction gas, and performing an atmospheric CVD (APCVD) process. A densification process on silicon oxide is also preferably performed at a temperature of about 1000° C. for a heating duration of about 10–30 minutes.

Figure 1A:
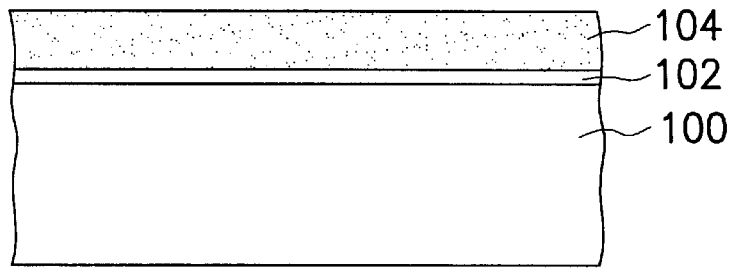
FIGS. 1A–1G are cross-sectional views of a portion of a substrate, schematically illustrating conventional fabrication processes for forming a MOS transistor.
Figure 1B:
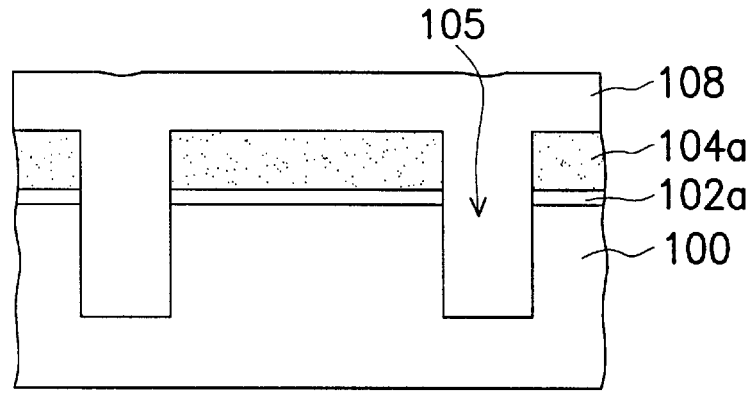
Figure 1C:
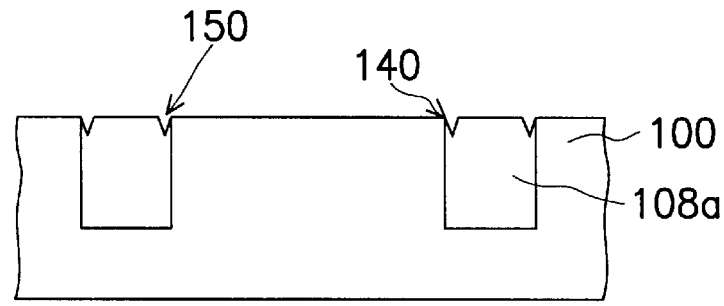
Figure 1D:
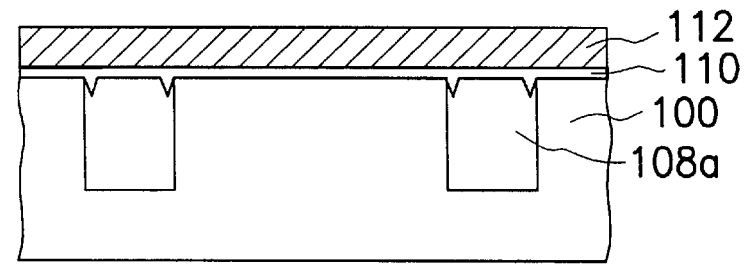
Figure 2C:
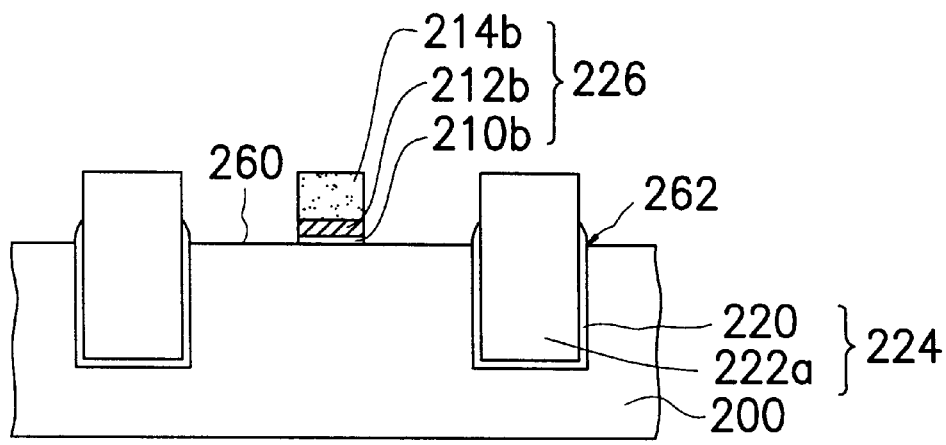

In FIG. 2B and FIG. 2C, the insulating layer 222 is planarized by, for example, chemical mechanical polishing (CMP). The polishing stop point is set at the cap layer 214a so that the portion of the cap layer 214a other than the opening 216 is exposed. A remaining portion of the insulating layer 222 becomes an insulating plug 222a to fill the opening 216. The insulating plug 222a and the liner oxide layer 220 form together as a STI structure 224. The STI structure 224 therefore has an exposed portion above a substrate surface 260 without being covered by the trench 218. The STI structure 224 has the same height as the cap layer 214a. Next, the cap layer 214a, the polysilicon layer 212a, and the oxide layer 210a are patterned and respectively become a gate cap layer 214b, a gate polysilicon layer 212b, and a gate oxide layer 210b, all of which form a first-stage gate structure 226 on the substrate surface 260. When the patterning process to form the first-stage gate structure 226 includes, for example, photolithography and etching. Since the liner oxide layer 220 extends up to the polysilicon layer 212a, a recess structure like the recess structure 150 of FIG. 1C is effectively prevented from occurring at corners 262. Moreover, since the polysilicon layer 212a and the oxide layer 210a are formed on the substrate 200 before the STI structure 224 is formed, even though a recess structure occurs, it does not affect the structure of the gate polysilicon layer 212b and the gate oxide layer 210b. A kink effect and a sub-threshold voltage are therefore effectively avoided.

Figure 2D:
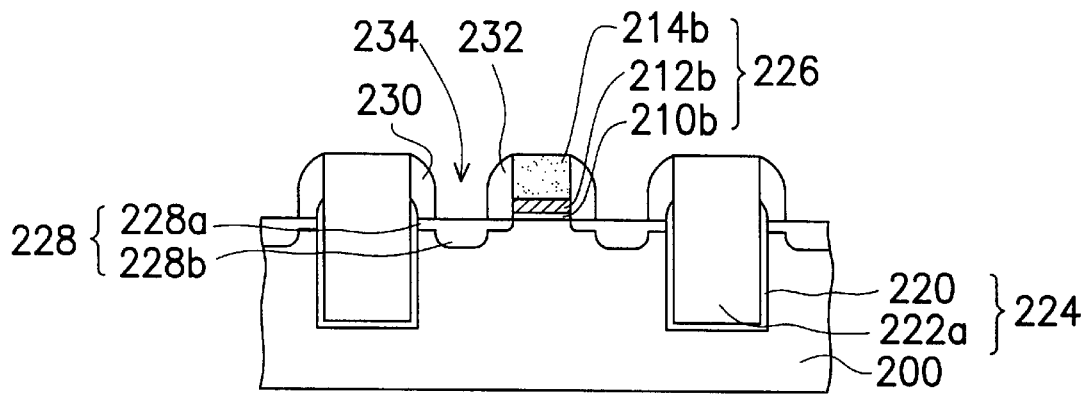

In FIG. 2C and FIG. 2D, using the first-stage gate structure 226 and the STI structure 224 as a mask, a light ion implantation process is performed to form a lightly doped region 228a in the substrate 200 at each side of the first-stage gate structure 226. Two spacers 232 are respectively formed on each sidewall of the first-stage gate structure 226 and several spacers 230 are respectively formed on the exposed sidewall of the STI structure 224. Using the first-stage gate structure 226, the STI structure 224, the spacers 232, and the spacers 230 as a mask, a light ion implantation process is performed to form a lightly doped region 228b in the substrate 200. Two interchangeable source/drain regions 228, which includes the lightly doped region 228a serving as a LDD structure and the heavily doped region 228b, are formed at each side of the first-stage gate structure 226. The spacers 230 cover the corners 262 and can further remedy a recess structure if it occurs.

The spacers 230, 232 includes, for example, a material with low dielectric constant and has a different etching rate from the gate cap layer 214b. If the gate cap layer includes silicon nitride, the spacers 232 includes, for example, silicon oxide. The formation of the spacers 230, 232 usually includes forming a preliminary dielectric layer (not shown) over the substrate 200, and performing an etching back process to remover the preliminary dielectric layer and leave the spacers 232, 230. Since spacers 230 behaves like the spacer 232, the lightly doped region 228a also formed below the spacers 230. This can further prevent the carriers from drifting across the STI structure 224. Moreover, several openings 234, that are, a frees space between the spacers 232, 230 are naturally formed to expose the interchangeable source/drain regions 228.

Figure 2E:
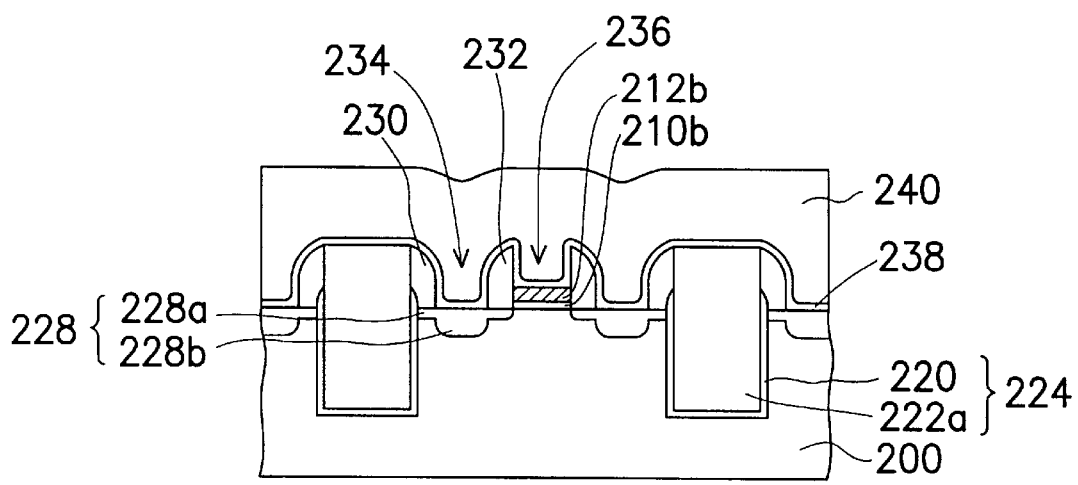

In FIG. 2D and FIG. 2E, the gate cap layer 214b is removed by, for example, either isotropic etching or anisotropic etching. After removing the gate cap layer 214b, an opening 236 is left to expose the gate polysilicon layer 212b. Since the etching rate is different, the gate cap layer 214b can be etched away without etching the other parts. If the gate cap layer 214b includes silicon nitride, and both the insulating plug 222a and the spacers 230, 232 include silicon oxide, a typical etching process including wet etching with etchant of hot phosphoric acid is performed. A conductive layer 240 is formed over the substrate 200 to that the openings 236, 234 are also filled. Before the conductive layer 240 is formed, a conformal barrier/glue layer 238 is preferably formed over the substrate 200. The conductive layer 240 include, for example, copper, tungsten, or other similar metallic materials. The purpose of the barrier/glue layer 238 is to prevent an inter-diffusion between the conductive layer 240 and the gate polysilicon layer 212b. The barrier/glue layer 238 usually includes, for example, Ti/TiN, Ta/TaN$_X$, or WN$_X$/WSi$_X$N$_Y$. If the conductive layer 240 includes tungsten, the barrier/glue layer 238 preferably includes Ti/TiN or WN$_X$/WSi$_X$N$_Y$. If the conductive layer 240 includes copper, the barrier/glue layer 238 preferably includes Ta/TaN$_X$. Since the opening 234 is formed through the spacers 230, the shape of the spacers 230 is very helpful for the step coverage performance. The opening 234 can be filled with a better step coverage. Moreover, the opening 234 is naturally formed, there is no need of patterning process.

Figure 2F:
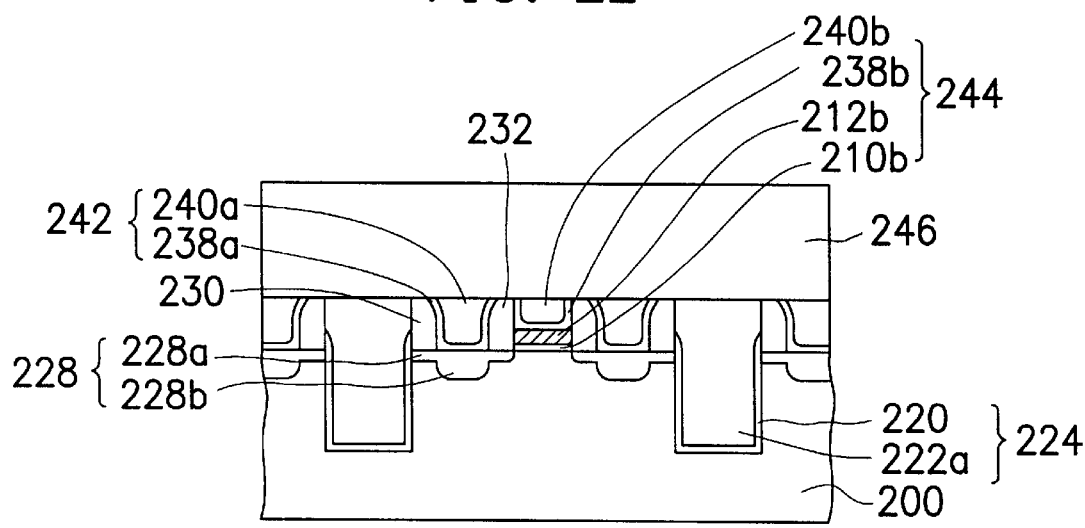

In FIG. 2F, a planarization process, such as a chemical mechanical polishing (CMP) process, is performed to remove a top portion of the conductive layer 240, the barrier/glue layer 238, and the spacers 230, 232 so that a gate metal layer 240b filling the opening 236 and a first contact plug 240a filling the opening 234 are formed. The first contact plug 240a is electrically coupled to the interchangeable source/drain regions 228. The gate structure 244 therefore includes the gate oxide layer 210b, the gate polysilicon layer 212b, the barrier/glue layer 238b, and the gate metal layer 240b. A first contact 242 includes the barrier/glue layer 238a and the first contact plug 240a.

Figure 1E:
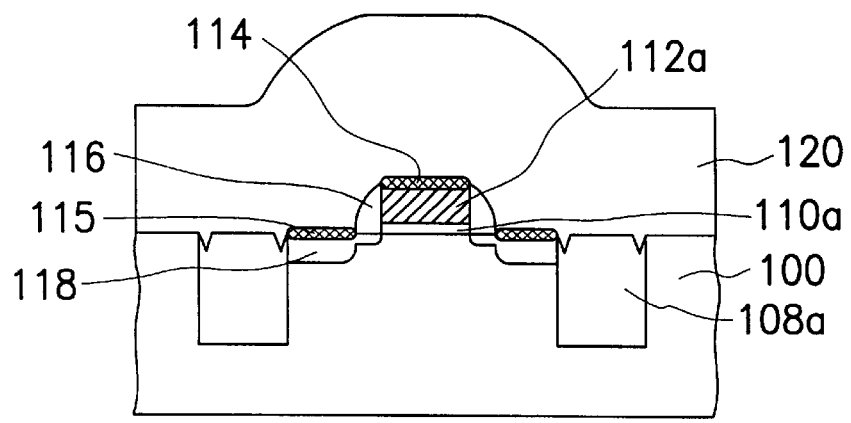

In the gate structure 244, since the gate metal layer 240b replaces the conventional gate polysilicon layer 112a of FIG. 1E so that the conventional Salicide layers 114, 115 of FIG. 1E are not necessary to be formed. The conventional Salicide layers 114, 115 consume the junction depth. Moreover, since the gate metal layer 240b and the first contact plug 240a are formed by CMP, there is no etching process involved. The acid-tank contamination can be completely avoided.

In FIG. 2F, all structures formed over the substrate 200 has a planar surface on top. An insulating layer 246 is formed over the substrate 200 at the planar surface so that the thickness of the insulating layer 246 is uniform. This is helpful for subsequently forming second contact plugs, which are to be shown in FIG. 2G, in the insulating layer 246. The insulating layer 246 includes, for example, silicon oxide, borophosphosilicate glass (BPSG), spin-on glass (SOG), or other materials with similar property, and is formed by, for example, a CVD process or a SOG coating process.

Figure 1F:
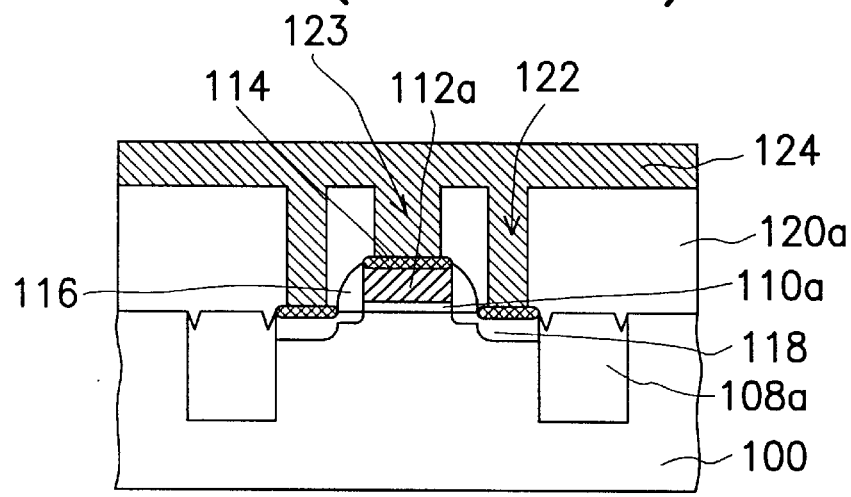
Figure 1G:
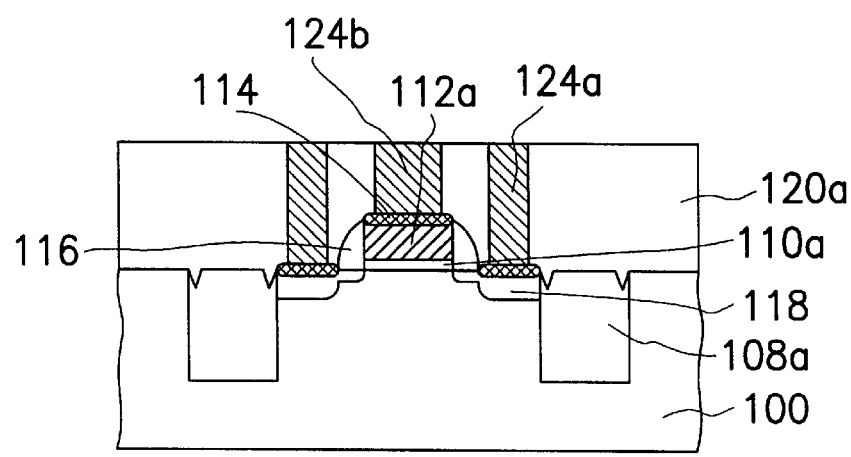
Figure 2G:
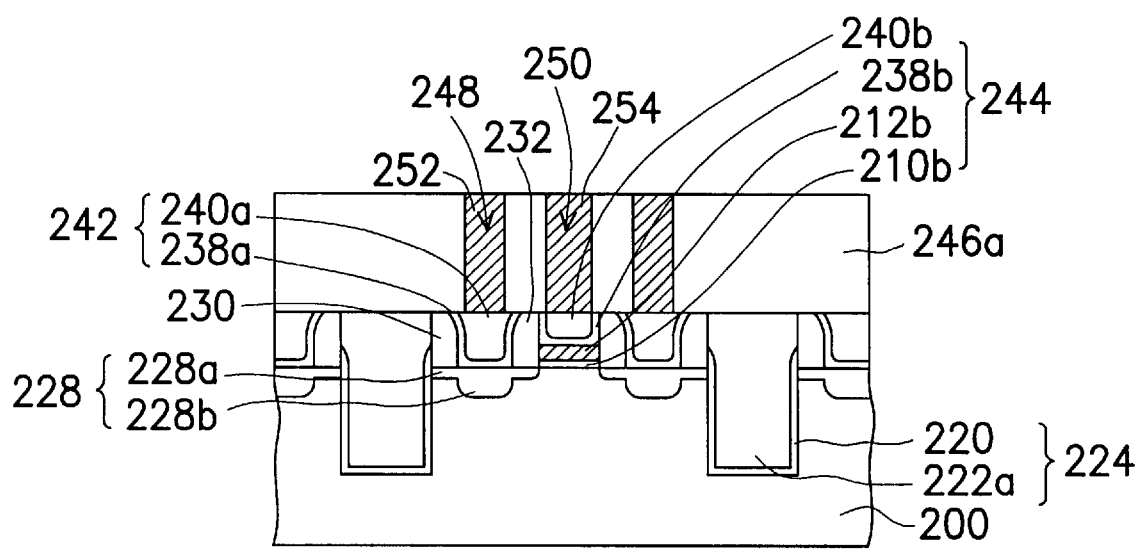

In FIG. 2G, the insulating layer 246 is patterned to formed openings 248, 250 through, for example, photolithography and etching. The insulating layer 246 becomes an insulating layer 246a. The opening 248 exposes the first contact 242, and the opening 250 exposes the gate structure 244. Since the openings 248, 250 have the same depth, the openings 248, 250 can be formed simultaneously without the extra etching time to expose the first contact 242. In conventional situation as shown in FIG. 1F, since the depth of the opening 123 is smaller than that of the opening 122, the Salicide layer 114 may be over etched, resulting in a damage. A junction contact plug 252 and a gate contact plug 254 are formed to respectively fill the opening 248 and the opening 250. The junction contact plug 252 is electrically coupled to the interchangeable source/drain regions 228 through the first contact 242. The gate contact plug 254 is electrically coupled to the gate structure 250. The junction contact plug 252 and the gate contact plug 254 are formed by, for example, forming a preliminary conductive layer over the substrate 200 to fill the openings 248, 250, and performing a planarization process to remove the preliminary conductive layer above the insulating layer 246a. The planarization process preferably includes a CMP process. A remaining portion of the preliminary conductive layer fills the openings 248, 250 to form the junction contact plug 252 and the gate contact plug 254. The contact plugs 252, 254 includes, for example, tungsten, copper, or aluminum. The method of the invention used two stages to form the first contact plug 240a and the junction contact plug 248 so as to form a contact on the interchangeable source/drain regions 228. The AR is therefore reduced. Moreover, the openings 234 of FIG. 2D are naturally formed with a taper structure so that there is no need to look for higher fabrication capability to form a taper opening with high AR.

The method of the invention for fabricating the MOS transistor is particularly suitable for fabricating a dynamic random access memory (DRAM) device or an embedded DRAM device.

In conclusion, the invention includes several characteristics as follows:

1. The kink effect on the STI structure at the trench corners 262 is avoided.

2. The gate metal layer 240b replaces the conventional gate polysilicon layer 112a so that the gate resistance is reduced. The response time is increased.

3. The formation of the gate metal layer 240b includes no etching process to that acid-tank contamination is avoided.

4. The method can reduce AR of contact opening on the interchangeable source/drain regions 228 to obtain a better step coverage.

5. The spacers 230, 232 automatically forms the opening 234 with a taper structure, which is helpful for step coverage. There is no need of a higher fabrication capability to form the taper contact in a highly reduced device dimension.

6. The first contact 240a can reduce the sheet resistance of the interchangeable source/drain regions 228.

7. The method is suitable for fabricating a borderless contact with simpler fabrication capability.

8. The spacer 230 on each exposed sidewall of the STI structure 224 allows a lightly doped region 228a is also formed at each side of the STI structure 223 so that the isolation capability of the STI structure 224 is increased.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a MOS transistor device on a semiconductor substrate, the method comprising:

sequentially formed an oxide layer, a polysilicon layer, and a cap layer over the substrate;

patterning the cap layer, the polysilicon layer, the oxide layer, and the substrate to form a first opening, which comprises a trench portion in the substrate and a top portion above a substrate surface;

forming a shallow trench isolation (STI) structure in the first opening;

further patterning the cap layer, the polysilicon layer, and the oxide layer so as to form a first-stage gate structure on the substrate, in which the first-stage gate structure comprises a gate cap layer, a gate polysilicon layer, and a gate oxide layer, wherein an exposed portion of the STI structure, originally filling the top portion of the first opening, is also formed;

forming an interchangeable source/drain region with a lightly doped drain (LDD) structure in the substrate at each side of the first-stage gate structure, wherein a plurality of spacers are also respectively formed on each sidewall of the first-stage gate structure and on each sidewall of the exposed portion of the STI structure;

removing the gate cap layer so as to leave a second opening that exposes the gate polysilicon layer; and filling the second opening and a free space between the spacers above the interchangeable source/drain region with a conductive material so as to respectively form a gate metal layer and a first contact plug, which has electrical contact with the interchangeable source/drain region, wherein the gate metal layer serves together with the gate polysilicon layer and the gate oxide layer as a gate structure.

2. The method of claim 1, wherein the step of forming the STI further comprises:

forming an insulating layer over the substrate so that the first opening is filled; and removing a portion of the insulating layer above the cap layer so that a remaining portion of the insulating layer fills the first opening.

3. The method of claim 2, wherein the step of removing the portion of the insulating layer comprises a chemical mechanical polishing (CMP) process.

4. The method of claim 2, wherein the insulating layer comprises silicon oxide.

5. The method of claim 2, wherein before the step of forming the insulating layer over the substrate, the method further comprises forming a liner oxide layer conformal to an inner peripheral surface of the first opening on the substrate, the oxide layer and the polysilicon layer.

6. The method of claim 2, wherein the cap layer has a different etching rate from the polysilicon layer and the insulating layer.

7. The method of claim 1, wherein the step of forming the interchangeable source/drain region further comprises:

using the first-stage gate structure and the STI structure as a mask, performing a light ion implantation process to form a lightly doped region in the substrate between the first-stage gate structure and the STI structure;

forming the spacers on each sidewall of the first-stage gate structure and on each sidewall of the exposed portion of the STI structure;

using the first-stage gate structure, the STI structure, and the spacers as a mask, performing a heavy ion implantation process to form a heavily doped region in the substrate between the spacers so as to form the interchangeable source/drain region, which comprises the LDD structure.

8. The method of claim 1, wherein the spacers comprise different etching rate from the cap layer so as to allow the gate metal layer can be individually removed in the step of removing the gate cap layer.

9. The method of claim 1, wherein the spacers comprises silicon oxide.

10. The method of claim 1, wherein the cap layer comprises silicon oxide.

11. The method of claim 1, wherein the step of filling the second opening and the free space further comprises:

forming a conductive layer over the substrate so as to fill the second opening and the free space;

performing a planarization process to planarize and remove a top portion of the conductive layer, the spacer and the STI structure so that a remaining portion of the conductive layer form the gate metal layer and the first contact plug, both of which are insulated by the spacers on the gate oxide layer.

12. The method of claim 11, wherein the step of performing the planarization process to planarize and remove the top portion of the conductive comprises a chemical mechanical polishing (CMP) process.

13. The method of claim 11, wherein the conductive layer comprises metallic material.

14. The method of claim 11, wherein the conductive layer comprises copper.

15. The method of claim 11, wherein before the step of forming the conductive layer over the substrate, the method further comprises forming a conformal barrier/glue layer over the substrate to serve together with the conductive layer.

16. The method of claim 15, wherein the barrier/glue layer comprises Ti/TiN, Ta/TaN$_X$, or WN$_X$/WSi$_X$N$_Y$.

17. The method of claim 1, wherein the method further comprises:

forming a planarized insulating layer over the substrate;

patterning the dielectric layer to simultaneously form a third opening to expose the interchangeable source/drain region, and a fourth opening to expose the gate structure; and filling the third opening and the fourth opening with conductive material to respectively form a junction contact plug and a gate contact plug.

18. The method of claim 17, wherein the step of filling the third opening and the fourth opening with conductive material further comprises:

forming a preliminary conductive layer over the substrate so that the third opening and the fourth opening are filled; and performing a planarization process to remove the preliminary conductive layer above the insulating layer so that a remaining portion of the preliminary conductive layer fills the third opening and the fourth opening.

19. The method of claim 18, wherein the step of performing the planarization process to remove the preliminary conductive layer comprises a CMP process.

20. The method of claim 18, wherein the preliminary conductive layer comprises copper, tungsten, or aluminum.

* * * * *